United States Patent [19]

Suzuki et al.

[11] 4,349,892
[45] Sep. 14, 1982

[54] MAGNETIC BUBBLE DETECTOR

[75] Inventors: Ryo Suzuki, Kodaira; Keiichi Uehara; Teruaki Takeuchi, both of Kokubunji; Masatoshi Takeshita, Hachioji, all of Japan

[73] Assignee: Hitachi, Ltd., Tokyo, Japan

[21] Appl. No.: 174,513

[22] Filed: Aug. 1, 1980

[30] Foreign Application Priority Data

Aug. 15, 1979 [JP] Japan .................................. 54-103138
Aug. 15, 1979 [JP] Japan .................................. 54-103139

[51] Int. Cl.³ .............................................. G11C 19/08
[52] U.S. Cl. ........................................... 365/8; 365/43
[58] Field of Search .................................. 365/8, 43

[56] References Cited

FOREIGN PATENT DOCUMENTS 625245 8/1978 U.S.S.R. .................................. 365/8

OTHER PUBLICATIONS

IEEE Transactions on Magnetics–vol. MAG–13, No. 6, Nov. 1977, pp. 1773–1776.
IBM Technical Disclosure Bulletin–vol. 18, No. 4, Sep. 1975, p. 1206.

Primary Examiner—James W. Moffitt
Attorney, Agent, or Firm—Craig and Antonelli

[57] ABSTRACT

A magnetic bubble detector according to this invention is constructed of a bubble expander, a bubble detecting element and a bubble sweeper. Moreover, at least the width of soft magnetic material-elements constituting the bubble detecting element as taken in the propagating direction of magnetic bubbles is greater than that of soft magnetic material-elements constituting the bubble expander. As a result, the distances or distance between the magnetic bubble in the bubble detecting element and the magnetic bubbles or bubble in the bubble expander and/or the bubble sweeper increase or increases, so that a magnetic bubble detector of high signal-to-noise ratio is provided.

14 Claims, 5 Drawing Figures

4,349,892

MAGNETIC BUBBLE DETECTOR

BACKGROUND OF THE INVENTION

1. Field of the Invention

This invention relates to a magnetic bubble memory, and more particularly to improvements in a detector which detects magnetic bubbles in such magnetic bubble memory.

2. Description of the Prior Art

Magnetic bubbles have their utility noted in a mass memory, a shift register etc. Research and development are vigorously carried forward at present, and various magnetic bubble memory devices have already been put into practical use. In such magnetic bubble memory, it is the most fundamental function to detect the existence or non-existence of the magnetic bubble representing an information. Detectors for the detection variously contrived have been proposed. Nowadays, there is generally used a detection system in which the magnetic bubble is detected and transformed into an electric signal by a transformer exploiting the magnetoresistance effect, the electric signal being delivered as an output.

FIG. 1 shows only a portion of a detector 1 in the "major line—minor loops" organization which is one of typical magnetic bubble memory organizations. Referring to the figure, magnetic bubbles (not shown) on a read-out major line 2 are propagated in the direction of arrow 3 in accordance with a rotating magnetic field. Thus, they reach an inlet 4 of the detector 1. The magnetic bubble having reached the inlet 4 of the detector 1 is further propagated along arrow 3' within the detector 1 in accordance with the rotating magnetic field. Here, the detector 1 is constructed of a bubble expander 5 which propagates the magnetic bubble while gradually expanding it in the direction orthogonal to the propagating direction, a bubble detecting element 6 which is a magnetoresistive element that grasps as a change of its resistance value a change of a magnetic flux at the time when the expanded magnetic bubble passes therethrough, and a bubble sweeper 7 which receives the magnetic bubble from the bubble detecting element 6 and sweeps it into a bubble sink such as guardrail. Accordingly, the magnetic bubble having arrived at the inlet 4 of the detector 1 is propagated in the vertical direction within the bubble expander 5 in accordance with the rotating magnetic field and is simultaneously expanded in the lateral direction, and the magnetic bubble in the state in which it has been expanded most passes through the bubble detecting element 6 and is annihilated via the bubble sweeper 7. Typical patterns of the bubble expander 5, the bubble detecting element 6 and the bubble sweeper 7 which constitute the detector 1 are shown in FIG. 2 as an enlarged pattern of a part which is enclosed with a circle 8 indicated by a broken line. As apparent from FIG. 2, the patterns forming the respective portions are constructed of single Chevron pattern elements 9 which are made of a soft magnetic material such as permalloy. The bubble expander 5 is constructed of a large number of rows in which the stacked numbers of the single Chevron pattern elements 9 in the lateral direction (in the direction orthogonal to the propagating direction of the magnetic bubble) increase gradually from the inlet 4 to the bubble detecting element 6. The magnetoresistive element which forms the bubble detecting element 6 is represented as a single crooked long line in which the connection between the apices of the adjacent single Chevron pattern elements 9 and the connection between the ends on one side are alternately made. The bubble sweeper 7 is constructed of several rows in which the single Chevron pattern elements 9 are stacked in fixed numbers.

In case where the magnetic bubble memory is constructed by employing the typical magnetic bubble detector 1 as stated above, the widths λ of the Chevron pattern elements 9 in the propagating direction 3' of the magnetic bubble are usually equal for all the bubble expander 5, the bubble detecting element 6 and the bubble sweeper 7. The width λ is set to be several times the diameter of the magnetic bubble used. In this regard, it is a recent trend that the memory capacity per chip increases more and more. Therefore, the diameter of the magnetic bubble to be used diminishes, and the dimensions of the respective patterns constituting the magnetic bubble memory become small accordingly. The detector 1 needs to be similarly constructed in the smallest possible area, and the widths λ of the Chevron pattern elements 9 to be used need to be also reduced.

However, in case where the widths λ of the Chevron pattern elements 9 of the bubble expander 5, the bubble detecting element 6 and the bubble sweeper 7 constituting the detector 1 were narrowed at the same ratio, a problem to be stated below occurred. The magnetic bubbles are detected when they pass through the latter half part of the bubble detecting element 6. At this time, a great output fluctuation ascribable to the interference between the adjoining magnetic bubble arises, resulting in an erroneous detection. For the countermeasure against this drawback, a detecting electric circuit becomes very complicated. More specifically, the output of a detection signal of a magnetic bubble A in the case where magnetic bubbles lie successively as B, A and C as illustrated in FIG. 2 decreases about 30% in comparison with the output of the detection signal of the magnetic bubble A in the case where only the magnetic bubble A lies. Of course, also the output of the magnetic bubble A in the case where the magnetic bubbles are successive as B and A or as A and C decreases though the amount of the decrease is not so large as in the case described above. Such decrease of the detection output attributed to the interference between the magnetic bubbles is a very troublesome problem, and any countermeasure has been desired.

SUMMARY OF THE INVENTION

It is accordingly an object of this invention to provide a novel magnetic bubble detector which is free from the problem described above.

To the accomplishment of the object, according to this invention, a magnetic bubble detector is characterized by comprising a bubble expander which propagates magnetic bubbles in a predetermined direction in accordance with a rotating magnetic field and which expands them gradually in a direction orthogonal to the propagating direction, a bubble detecting element which is disposed in adjacency to said bubble expander on a rear side in said propagating direction of said magnetic bubbles and which detects the existence or non-existence of the magnetic bubble as an electric signal, and a bubble sweeper which is disposed in adjacency to said bubble detecting element on a rear side in said propagating direction of said magnetic bubbles and which sweeps said magnetic bubbles, at least a width of soft magnetic material-elements constituting said bubble detecting element as taken in said propagating direction of said magnetic bubbles made greater than a width of soft magnetic material-elements constituting said bubble expander as taken in said propagating direction of said magnetic bubbles.

In accordance with such characterizing construction of this invention, when the existence or non-existence of the magnetic bubble is detected by the bubble detecting element, the spacing between the particular magnetic bubble and the preceding or succeeding magnetic bubble is greater. As a result, the interference between the magnetic bubbles lessens, so that the decrease of the detection output is very slight and is negligible. Further, the width of patterns constituting the bubble expander which occupies a considerable proportion of the area of the whole detector can be reduced in conformity with the diameter of the magnetic bubbles, so that the area itself of the detector can be reduced. This can contribute to rendering the packaging density of a chip high.

DETAILED DESCRIPTION

Figure 1:
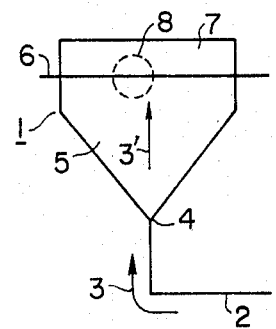
FIG. 1 is a general constructional view of a magnetic bubble detector which is used in this invention.
Figure 2:
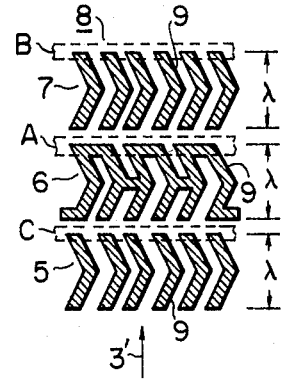
FIG. 2 is a partial enlarged view of a prior-art detector pattern in FIG. 1.
Figure 3:
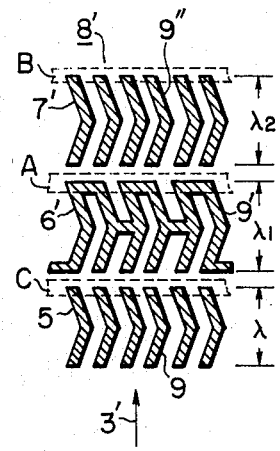
FIG. 3 is a partial enlarged view of a detector pattern according to this invention.

FIG. 3 shows on enlarged scale a part of a magnetic bubble detector according to this invention. The general construction of the detector for a magnetic bubble memory according to this invention is quite the same as that of the detector 1 described in the statement of the prior art with reference to FIG. 1. That is, the detector according to this invention is made up of the bubble expander 5, the bubble detecting element 6 and the bubble sweeper 7 in FIG. 1, and the constructions and functions of these portions are as already stated. The characterizing feature of this invention resides in unequal widths of patterns constituting these portions. Accordingly, only the characterizing point of this invention will be described in detail here. Since the general construction of the detector according to this invention is the same as that of the detector shown in FIG. 1, typical patterns of the bubble expander, the bubble detecting element and the bubble sweeper which constitute the detector are shown by reference numeral 8' in FIG. 3 as the enlarged pattern of the part enclosed with the circle depicted by the broken line. Thus, the detector according to this invention is constructed of the bubble expander 5, the bubble detecting element 6' and the bubble sweeper 7'. The Chevron pattern elements 9 constituting the bubble expander 5 have the same width $\lambda$ as in the prior art. In contrast, the widths $\lambda_1$ and $\lambda_2$ of the Chevron pattern elements 9' and 9'' constituting the bubble detecting element 6' and the bubble sweeper 7' are respectively made 25% greater than the width $\lambda$ of the Chevron pattern elements 9 constituting the bubble expander 5 as apparent from FIG. 3. The widths $\lambda_1$ and $\lambda_2$ of the Chevron pattern elements 9' and 9'' need not be equal to each other. In actuality, however, it is desirable from the standpoints of reducing the number of stages for the fabrication of the patterns etc. that the width $\lambda_1$ of the Chevron pattern elements 9' and the width $\lambda_2$ of the Chevron pattern elements 9'' are equal. In this manner, the widths $\lambda_1$ and $\lambda_2$ of the Chevron pattern elements 9' and 9'' constituting the bubble detecting element 6' and the bubble sweeper 7' are respectively made 25% greater than the width $\lambda$ of the Chevron pattern elements 9 constituting the bubble expander 5, whereby the detection output of the magnetic bubble A scarcely changes irrespective of whether or not the magnetic bubbles B and C exist before and behind the magnetic bubble A in case of detecting the magnetic bubble A by means of the bubble detecting element 6'.

Figure 4:
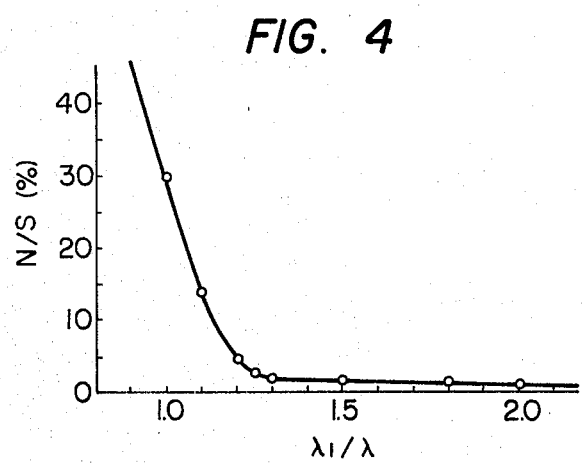
FIG. 4 is a graph illustrating the effect of the detector according to this invention shown in FIG. 3.

Now, an example of experiment demonstrating the effect of this invention will be explained. FIG. 4 is a graph in which the axis of abscissas represents the ratio between the width $\lambda_1$ of the Chevron pattern elements 9' (=the width $\lambda_2$ of the Chevron pattern elements 9'') and the width $\lambda$ of the Chevron pattern elements 9, that is, the ratio $\lambda_1 (=\lambda_2)/\lambda$, while the axis of ordinates represents the percentage of the ratio between a noise (N) and a signal (S). Data were obtained by varying the ratio $\lambda_1(=\lambda_2)/\lambda$. Regarding measurement conditions in this case, the dimensions of the Chevron pattern elements 9 constituting the bubble expander 5 were fixed at a width ($\lambda$) of 8 $\mu$m, a boldness of 1.2 $\mu$m and a thickness of 4,000 Å, and magnetic bubbles having a diameter of 1.8 $\mu$m were employed. The Chevron pattern elements 9' constituting the bubble detecting element 6' and the Chevron pattern elements 9'' constituting the bubble sweeper 7' were formed in the same dimensions (the boldnesses and thicknesses of the elements 9' and 9'' were equal to those of the Chevron pattern elements 9), and only the width $\lambda_1(=\lambda_2)$ was made unequal to that of the Chevron pattern elements 9. The percentage values between the noise (N) and the signal (S) at various ratios of $\lambda_1/\lambda$ were obtained. (The detection output in the presence of only the magnetic bubble A in FIG. 3 is the signal (S). A value obtained by subtracting the detection output in the presence of the magnetic bubbles A, B and C from the signal (S), that is, a signal lowering component is the noise (N).) As seen from FIG. 4, when the ratio $\lambda_1/\lambda$ is 1.0, that is, when the prior-art construction is used, the signal lowering rate or N/S value is about 30%. When the ratio $\lambda_1/\lambda$ is increased, the N/S value decreases abruptly. Thereafter, as the ratio $\lambda_1/\lambda$ is increased more, the N/S value decreases slowly. These circumstances indicate that when the widths $\lambda_1$ and $\lambda_2$ of the Chevron pattern elements 9' and 9'' constituting the bubble detecting element 6' and the bubble sweeper 7' were made greater even slightly than the width $\lambda$ of the Chevron pattern elements 9 constituting the bubble expander 5, the interference between the magnetic bubbles lessens, so the action of reducing the detection output weakens. In practice, it is the most desirable that the ratio $\lambda_1/\lambda$ lies within a range of 1.2–2.0. The reasons are that when the ratio $\lambda_1/\lambda$ becomes less than 1.2, the N/S value becomes 5% or more, which unpractically renders the detecting electric circuit complicated, and that when the ratio $\lambda_1/\lambda$ exceeds 2.0, undesirably a problem is posed in the transfer of the magnetic bubbles.

In the above example of experiment, the width $\lambda_1$ and the width $\lambda_2$ were made equal. However, even when they were individually changed, substantially the same trends as in FIG. 4 were exhibited.

Figure 5:
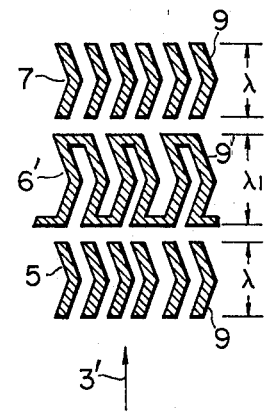
FIG. 5 is a partial enlarged view of a pattern which is another embodiment according to this invention.

The foregoing embodiment exemplifies the case where both the widths $\lambda_1$ and $\lambda_2$ of the Chevron pattern elements 9' and 9" respectively constituting the bubble detecting element 6' and the bubble sweeper 7' are greater than the width λ of the Chevron pattern elements 9 constituting the bubble expander 5. This embodiment is the optimum form of this invention, and it is a matter of course that the invention is not restricted thereto but that it also includes the following construction. The construction is as illustrated in FIG. 5 wherein the width $\lambda_1$ of the Chevron pattern elements 9' constituting the bubble detecting element 6' is greater than the widths λ, λ of the Chevron pattern elements 9, 9 constituting the bubble expander 5 and the bubble sweeper 7. The magnetic bubble detector thus constructed can prevent the interference between the magnetic bubbles so as to lower the N/S value likewise to the foregoing embodiment. The previous embodiment has been described as to the case where the magnetic bubbles enter the detector in succession. Needless to say, however, this invention is effective to prevent the interference between magnetic bubbles also in case where the magnetic bubble enters the detector every second bit.

When, in this manner, at least the width $\lambda_1$ of the Chevron pattern elements 9' constituting the bubble detecting element 6' is greater than the width λ of the Chevron pattern elements 9 constituting the bubble expander 5, another excellent effect as stated below is also achieved. Small fluctuations in the detection output which is obtained from the bubble detecting element 6' become minute. When the width $\lambda_1$ becomes 12 μm or above, the fluctuations are less than 0.25 mV and incur quite no problem in practical use.

Although the examples in which the bubble detecting elements 6' shown in FIG. 3 and FIG. 5 are used as the magnetoresistive elements have been referred to, a magnetoresistive element in any other connection system employing Chevron pattern elements may of course be used as well.

Further, although the examples of the basic shapes have been referred to as the shapes of the Chevron pattern elements, modified Chevron pattern elements may well be used.

As set forth above, the detector according to this invention makes it possible to reduce the occupying area of the whole detector without incurring the output decrease ascribable to the interference between the magnetic bubbles. As a result, it can contribute to the increase of the memory capacity per magnetic bubble chip.

We claim:

1. A magnetic bubble detector comprising a bubble expander which propagates magnetic bubbles in a predetermined direction in accordance with a rotating magnetic field and which expands them gradually in a direction orthogonal to the propagating direction, a bubble detecting element which is disposed in adjacency to said bubble expander on a rear side in which propagating direction of the magnetic bubbles and which detects the existence or non-existence of the magnetic bubble as an electric signal, said bubble detecting element comprising single pattern soft magnetic material-elements extending in said propagating direction of the magnetic bubbles, and a bubble sweeper which is disposed in adjacency to said bubble detecting element on a rear side in said propagating direction of the magnetic bubbles and which sweeps the magnetic bubbles, at least a width of said soft magnetic material-elements constituting said bubble detecting element as taken in said propagating direction of the magnetic bubbles being greater than a width of soft magnetic material-elements constituting said bubble expander as taken in said propagating direction of the magnetic bubbles.

2. A magnetic bubble detector according to claim 1, wherein both said width of said soft magnetic material-elements constituting said bubble detecting element and a width of soft magnetic material-elements constituting said bubble sweeper are greater than said width of said soft magnetic material-elements constituting said bubble expander.

3. A magnetic bubble detector according to claim 1, wherein said width of said soft magnetic material-elements constituting said bubble detecting element is at least 12 μm.

4. A magnetic bubble detector according to claim 2, wherein said widths of said soft magnetic material-elements constituting said bubble detecting element and said bubble sweeper are 1.2–2.0 times greater than said width of said soft magnetic material-elements constituting said bubble expander.

5. A magnetic bubble detector according to claim 1, wherein the magnetic bubble is detected during the propagation along said width of said soft magnetic material-elements constituting said bubble detecting element and, said soft magnetic material-elements constituting said bubble expander being of said single pattern of said bubble detecting element.

6. A magnetic bubble detector according to claim 5, wherein said single pattern is a single Chevron pattern.

7. A magnetic bubble detector according to claim 5 or claim 6, wherein said width of said soft magnetic material-elements constituting said bubble detecting element is 1.2–2.0 times greater than said width of said soft magnetic material-elements constituting said bubble expander.

8. A magnetic bubble detector comprising a bubble expander which propagates magnetic bubbles in a predetermined direction in accordance with a rotating magnetic field and which expands the magnetic bubbles gradually in a direction orthogonal to the propagating direction, said bubble expander including soft magnetic material-elements of a single pattern extending in the propagating direction, a bubble detecting element disposed adjacent to a rear side of said bubble expander in the propagating direction of the magnetic bubbles for detecting the existence or non-existence of the magnetic bubble as an electric signal, said bubble detecting element including soft magnetic material-elements of said single pattern extending in the propagating direction, and a bubble sweeper disposed adjacent to a rear side of said bubble detecting element in the propagating direction of the magnetic bubbles for sweeping the magnetic bubbles, said soft magnetic material-elements of said bubble detecting element including means for increasing the distance between successive magnetic bubbles passing through said bubble detecting element with respect to the distance between the successive bubbles passing through said bubble expander so as to enable a high signal-to-noise ratio within said bubble detector.

9. A magnetic bubble detector according to claim 8, wherein said means for increasing the distance includes configuring said soft magnetic material-elements of said bubble detecting element to have a width as taken in the propagating direction which is greater than a width of said soft magnetic material-elements of said bubble expander as taken in the propagating direction.

10. A magnetic bubble detector according to claim 9, wherein said soft magnetic material-elements of said bubble detecting element detect the existence or non-existence of the magnetic bubble along the width thereof, said single pattern being a single Chevron pattern.

11. A magnetic bubble detector according to claim 9, wherein the width of said soft magnetic material-elements of said bubble detecting element is 1.2–2.0 times greater than the width of said soft magnetic material-elements of said bubble expander.

12. A magnetic bubble detector according to claim 11, wherein said bubble sweeper comprises soft magnetic material-elements having said single pattern with a width 1.2–2.0 times greater than the width of said soft magnetic material-elements of said bubble expander.

13. A magnetic bubble detector according to claim 12, wherein said single pattern is a single Chevron pattern.

14. A magnetic bubble detector according to claim 11, wherein the width of said soft magnetic material-elements of said bubble detecting element is at least 12 $\mu$m.

* * * * *